United States Patent
Bernier et al.

(10) Patent No.: US 7,067,916 B2
(45) Date of Patent: Jun. 27, 2006

(54) EXTENSION OF FATIGUE LIFE FOR C4 SOLDER BALL TO CHIP CONNECTION

(75) Inventors: William E. Bernier, Endwell, NY (US); Charles F. Carey, Endicott, NY (US); Eberhard B. Gramatzki, Essex Junction, VT (US); Thomas R. Homa, Binghamton, NY (US); Eric A. Johnson, Greene, NY (US); Pierre Langevin, Granby (CA); Irving Memis, Vestal, NY (US); Son K. Tran, Endwell, NY (US); Robert F. White, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 613 days.

(21) Appl. No.: 09/885,853

(22) Filed: Jun. 20, 2001

(65) Prior Publication Data

US 2002/0195707 A1 Dec. 26, 2002

(51) Int. Cl.
    *H01L 23/48* (2006.01)

(52) U.S. Cl. .................................................... 257/747
(58) Field of Classification Search ................ 257/747, 257/786, 788; 438/108; 324/765
    See application file for complete search history.

(56) References Cited

U.S. PATENT DOCUMENTS

| 5,075,965 | A | * | 12/1991 | Carey et al. ................. 29/840 |
| 5,567,655 | A | | 10/1996 | Rostoker et al. |
| 5,808,853 | A | * | 9/1998 | Dalal et al. ............... 361/306.1 |
| 5,889,326 | A | | 3/1999 | Tanaka |
| 5,977,632 | A | | 11/1999 | Beddingfield |
| 6,016,011 | A | | 1/2000 | Cao et al. |
| 6,072,242 | A | | 6/2000 | Son |
| 6,084,312 | A | | 7/2000 | Lee |
| 6,088,236 | A | | 7/2000 | Tomura et al. |
| 6,143,639 | A | | 11/2000 | Medlen et al. |
| 6,153,938 | A | * | 11/2000 | Kanda et al. ................ 257/778 |
| 6,166,556 | A | * | 12/2000 | Wang et al. ................. 324/765 |
| 6,310,403 | B1 | * | 10/2001 | Zhang et al. ................ 257/786 |
| 6,320,254 | B1 | * | 11/2001 | Liou et al. ................... 257/688 |
| 6,342,399 | B1 | * | 1/2002 | Degani ......................... 438/14 |
| 6,399,178 | B1 | * | 6/2002 | Chung ......................... 428/131 |
| 6,592,019 | B1 | * | 7/2003 | Tung ........................... 228/197 |

FOREIGN PATENT DOCUMENTS

| JP | 2000306951 | 3/2001 |
| JP | 64002338 | 10/2002 |

* cited by examiner

*Primary Examiner*—Matthew Smith
(74) *Attorney, Agent, or Firm*—Schmeiser, Olsen & Watts; William H. Steinberg

(57) ABSTRACT

A method and structure for coupling a semiconductor substrate (e.g., a semiconductor chip) to an organic substrate (e.g., a chip carrier). The coupling interfaces a solder member (e.g., a solder ball) to both a conductive pad on the semiconductor substrate and a conductive pad on the organic substrate. Thermal strains on the solder member during thermal cycling may be reduced by having a surface area of the pad on the semiconductor substrate exceed a surface area of the pad on the organic substrate. Thermal strains on the solder member during thermal cycling may also be reduced by having a distance from a centerline of the solder member to a closest lateral edge of the semiconductor substrate exceed about 0.25 mm.

19 Claims, 4 Drawing Sheets

SOLDER BALL THERMAL CYCLING FATIGUE TEST DATA

| ROW | SAMPLE SIZE | CHIP SIZE (mm x mm) | ORGANIC SUBSTRATE PAD DIAMETER, D2 (mm) | CHIP PAD DIAMETER, D1 (mm) | D1/D2 | S1/S2 | SOLDER BALL HEIGHT (μm) | DISTANCE ($D_{EDGE}$) FROM SOLDER BALL CENTERLINE TO CHIP EDGE (μm) | NO. OF CYCLES TO 50% FAILS | FIRST CYCLE TO FAIL |
|---|---|---|---|---|---|---|---|---|---|---|
| 1 | 47 | 8.7 x 8.7 | 160 | 140 | 0.88 | 0.77 | 110 | 230 | 13260 | 2500 |
| 2 | 30 | 8.7 x 8.7 | 155 | 140 | 0.90 | 0.81 | 110 | 100 | 8430 | 2500 |
| 3 | 19 | 8.7 x 8.7 | 160 | 140 | 0.88 | 0.77 | 110 | 100 | 7963 | 2500 |
| 4 | 75 | 7.68 x 7.68 | 160 | 100 | 0.63 | 0.40 | 100 | 100 | 3250 | 600 |

*FIG. 2*

EXTENSION OF FATIGUE LIFE FOR C4 SOLDER BALL TO CHIP CONNECTION

BACKGROUND OF THE INVENTION

1. Technical Field

The present invention relates to a method and structure for coupling a semiconductor chip to an organic chip carrier by a solder ball.

2. Related Art

A solder ball that couples a semiconductor chip to an organic chip carrier is subject to thermally induced strain during thermal cycling. The thermally induced strain inevitably causes damage to the solder leading to cracking and electrical failure if sufficient cycles occur. Thus, a method and structure is needed for reducing the aforementioned thermally induced strain and increasing the fatigue life.

SUMMARY OF THE INVENTION

The present invention provides an electronic structure, comprising:

a semiconductor substrate having a first electrically conductive pad thereon;

an organic substrate having a second electrically conductive pad thereon, wherein a surface area of the first pad exceeds a surface area of the second pad; and a solder member electrically coupling the first pad to the second pad.

The present invention provides an electronic structure, comprising:

a semiconductor substrate having a first electrically conductive pad thereon;

an organic substrate having a second electrically conductive pad thereon; and a solder member electrically coupling the first pad to the second pad, wherein a distance from a centerline of the solder member to a closest lateral edge of the semiconductor substrate is at least about 0.25 mm.

The present invention provides a method of forming an electronic structure, comprising:

forming a semiconductor substrate having a first electrically conductive pad thereon;

forming an organic substrate having a second electrically conductive pad thereon, wherein a surface area of the first pad exceeds a surface area of the second pad; and electrically coupling, by use of a solder member, the first pad to the second pad.

The present invention provides a method of forming an electronic structure, comprising:

forming a semiconductor substrate having a first electrically conductive pad thereon;

forming an organic substrate having a second electrically conductive pad thereon; and electrically coupling, by use of a solder member, the first pad to the second pad, wherein a distance from a centerline of the solder member to a closest lateral edge of the semiconductor substrate is at least about 0.25 mm.

The present invention reduces thermally induced strain that occurs in a solder ball during thermal cycling, wherein the solder ball couples a semiconductor chip to an organic chip carrier.

BRIEF DESCRIPTION OF THE DRAWINGS

FIG. 2 is a table of thermal cycling fatigue test data for the solder ball of FIG. 1.

DETAILED DESCRIPTION OF THE INVENTION

Figure 1:
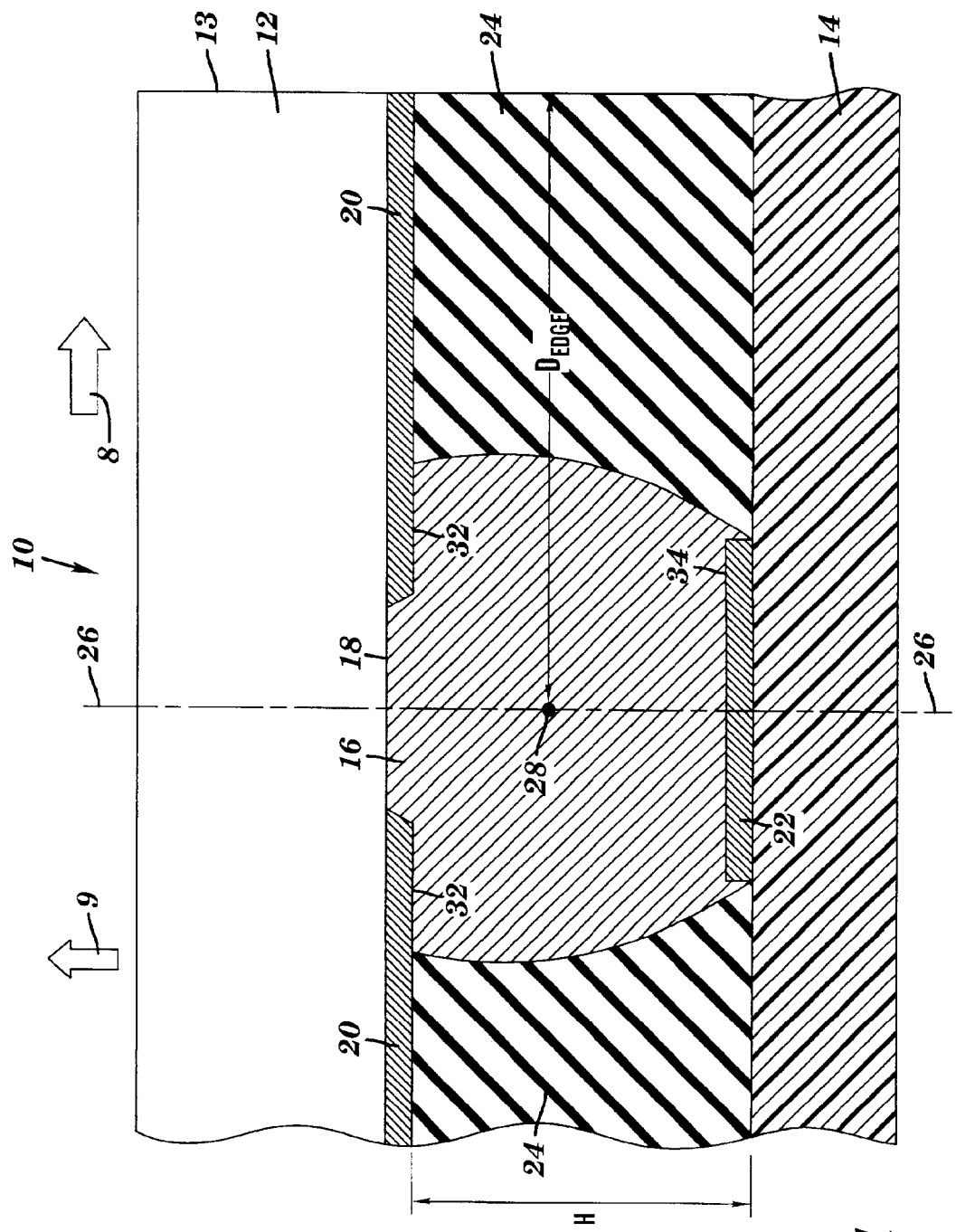
FIG. 1 depicts a front cross-sectional view of a semiconductor chip coupled to an organic chip carrier by a solder ball, in accordance with embodiments of the present invention.

FIG. 1 illustrates a front cross-sectional view of an electronic structure 10, in accordance with embodiments of the present invention. The electronic structure 10 includes a semiconductor substrate 12 coupled to an organic substrate 14 by a solder member 16. The solder member 16 is mechanically and electrically coupled to an electrically conductive pad 20 on the semiconductor substrate 12. The solder member 16 is likewise mechanically and electrically coupled to an electrically conductive pad 22 on the organic substrate 14.

The semiconductor substrate 12 may include, inter alia, a semiconductor chip (e.g., a silicon chip or a germanium chip). The semiconductor substrate 12 may have a coefficient of thermal expansion (CTE) of about 3 ppm/° C., wherein ppm stands for parts per million.

The organic substrate 14 includes, inter alia, an organic material such as an epoxy, a polyimide, a polytetrafluoroethylene (PTFE), glass cloth, copper-invar-copper or other reinforcing layers, and combinations thereof. The organic substrate 14 may include, inter alia, an organic chip carrier. The organic substrate 14 has a CTE between about 10 ppm/° C. and about 18 ppm/° C.

The solder member 16 may include, inter alia, a solder ball such as a controlled collapse chip connection (C4) solder ball. The solder member 16 may include, inter alia, a eutectic lead-tin alloy (i.e., about 63% lead and 37% tin, by weight), a high-melt lead-tin alloy, a eutectic-tipped, high-melt alloy, an unleaded solder, etc. As an example, the high-melt lead-tin alloy may have lead and tin in a ratio of 97:3 by weight with a melting temperature of about 330° C. The solder member 16 has a CTE between about 21 ppm/° C. and about 28 ppm/° C. In particular, a lead-tin alloy having a 97:3 weight concentration ratio has a CTE of about 28 ppm/° C.

An underfill material 24 exists between the semiconductor substrate 12 and the organic substrate 14, wherein the underfill material 24 encapsulates the solder member 16, and wherein the underfill material 24 has an elastic modulus of at least about 1 gigapascal (GPa). The underfill material 24 serves to reduce thermal stresses on the solder member 16, wherein such thermal stresses may occur during thermal cycling operations. Any underfill material known to one of ordinary skill in the art may be used for the underfill material 24. Examples of known underfill materials include, inter alia, Dexter CNB840-38 and Namics U8437-2.

The electronic structure 10 may be fabricated as follows. The semiconductor substrate 12 is formed, or otherwise provided, with the pad 20 thereon. The organic substrate 14 is formed, or otherwise provided, with the pad 22 thereon. A high-melt lead-tin solder is deposited and shaped on the pad 20 of the semiconductor substrate 12 to form a solder ball. A eutectic lead-tin solder paste is deposited on the pad 22 of the organic substrate 14. The high-melt solder on the pad 20 is placed in contact with the eutectic solder paste on the pad 22. The solder paste is reflowed at a temperature below the melting temperature of the high-melt lead-tin solder, and then cooled, to form the solder member 16 that mechanically and electrically couples the semiconductor substrate 12 to the organic substrate 14. The underfill material 24 may be subsequently placed between the semiconductor substrate 12 and the organic substrate 14 such that the underfill material 24 encapsulates the solder member 16.

Notwithstanding the role of the underfill material 24 in mitigating thermal stresses on the solder member 16, such reduced thermal stresses may nonetheless cause cracking of the solder member 16 at the interface between the solder member 16 and the pad 20. The interface between the solder member 16 and the pad 20 is more prone to thermal stress damage than is the interface between the solder member 16 and the pad 22, because the local mismatch in CTE between the solder member 16 and the semiconductor substrate 12, that is coupled to the pad 20, is greater than the mismatch between the solder member 16 and the organic substrate 14 which is coupled to the pad 22. The thermal stress damage adversely impacts the fatigue life of the interface between the solder member 16 and the pad 20.

The present invention discloses two inventive techniques for extending the fatigue life of the interface between the solder member 16 and the pad 20. With the first inventive technique, a ratio S1/S2 exceeds 1, wherein S1 is a surface area of the surface 32 of the pad 20 of the semiconductor substrate 12 that is wetted by the solder, and S2 is a surface area of the surface 34 of the pad 22 of the organic substrate 14. With the second inventive technique, a distance in a direction 8 from a centerline 26 of the solder member 16 to a closest lateral edge 13 of the semiconductor substrate 12 exceeds about 0.25 mm. The centerline 26 is defined as passing through a centroid 28 of the solder member 16 and being oriented in a direction 9 that is perpendicular to the surface 32.

By increasing S1 relative to S2, the first inventive technique of having S1/S2 exceed 1 reduces the thermal stress and consequent thermal strain on the solder member 16 at the pad 20 as compared with the thermal stress and consequent thermal strain on the solder member 16 at the pad 22. The first inventive technique offsets a portion of the higher thermal stress on the solder member 16 at the pad 20, wherein said higher thermal stress is due to the relatively higher CTE differential between the solder member 16 and the semiconductor substrate 12, as compared with the CTE differential between the solder member 16 and the organic substrate 14.

FIG. 2 is a table of thermal cycling fatigue test data for the solder member 16 of FIG. 1, which demonstrates that increasing S1/S2 increases the fatigue life of an interface between the solder member 16 and the pad 20 of FIG. 1. In the tests underlying FIG. 2, the electronic structure 10 was thermally cycled from 100° C. to 0° C., and back to 100° C., in each cycle. The semiconductor substrate 12 is a silicon semiconductor chip, the organic substrate 14 is an organic chip carrier comprising a glass epoxy core with organic buildup layers, and the solder member 16 is a C4 solder ball comprising a lead-tin alloy having weight concentrations of about 97% lead and about 3% tin. An underfill 24 material of Namics U8437-2 material having an elastic modulus of 7 GPa was used.

The column titles appearing in the first row of the FIG. 2 are as follows. The "Row" column denotes row numbers. The "Sample Size" column denotes the number of same electronic structure 10 samples used in each batch tested. The "Chip Size" denotes the chip dimensions along surface 18 of the chip 12. The pad 22 has a diameter as denoted in the "Organic Substrate Pad Diameter, D2" column. The pad 20 has a diameter as denoted in the "Chip Pad Diameter, D1" column. The "D1/D2" column denotes the ratio of D1 to D2. The "S1/S2" column denotes S1/S2 such that S1/S2=(D1/D2)$^2$. The "Solder Ball Height" column denotes the height H in the direction 9 shown in FIG. 1. The "Distance (D$_{EDGE}$) From Solder Ball Centerline To Chip Edge" column denotes the distance D$_{EDGE}$ in the direction 8 shown in FIG. 1. The "No. Of Cycles to 50% Fails" column denotes the number of cycles at which 50% of the samples failed, which was computed by averaging over the Sample Size. The "First Cycle To Fail" column has a tolerance of 500 cycles, since the samples were tested for failure at every 500 cycles, with the exception of row 5 for which the samples were tested for failure at every 100 cycles. A failure of a sample is defined as crack in the solder member 16 or a delamination of the solder member 16 from the pad 20.

As seen in rows 4 and 3 in FIG. 2, as S1/S2 is increased from 0.40 to 0.77, the No. of Cycles to 50% Fails increases from 3250 to 7963, and the First cycle to Fail increases from 600 to 2500. Note that rows 2 and 3 are consistent with rows 3 and 4, since as S1/S2 increases from 0.77 to 0.81, the No. of Cycles to 50% Fails increases from 7963 to 8430. Note that in rows 2, 3, and 4, D$_{EDGE}$ has the same value of 100 μm.

The preceding results confirm that increasing S1/S2 improves fatigue life, which is the basis for the first inventive technique of the present invention. Finite element modeling has been used to predict the increase in fatigue life over an extended range of the ratio S1/S2. The first inventive technique includes several embodiments with respect to S1/S2. A first embodiment of the first inventive technique is S1/S2>1. A second embodiment of the first inventive technique is having S1 exceed S2 by a factor of at least about 1.2. A third embodiment of the first inventive technique is having S1 exceed S2 by a factor between about 1.1 and about 1.3. A fourth embodiment of the first inventive technique is having S1 exceed S2 by a factor between about 1.3 and about 2.0.

Rows 1 and 3 of FIG. 2 demonstrate the second inventive technique of the present invention. D$_{EDGE}$ equals 230 μm (i.e., 0.23 mm or 9 mils) and 100 μm (i.e., 0.10 mm or 4 mils) for rows 1 and 3, respectively. For rows 1 and 3, FIG. 2 shows that the Number of Cycles to 50% Fails increases from 7963 cycles to 13260 cycles to as D$_{EDGE}$ is increased from 100 μm to 230 μm (i.e., from 0.10 mm to 0.23 mm). Thus, at distances D$_{EDGE}$ within hundreds of microns from the nearest chip edge 13 (see FIG. 1), increasing D$_{EDGE}$ results in going to more cycles to reach the 50% failure level. Note that in rows 1 and 3, S1/S2 has the same value of 0.77.

Figure 3:
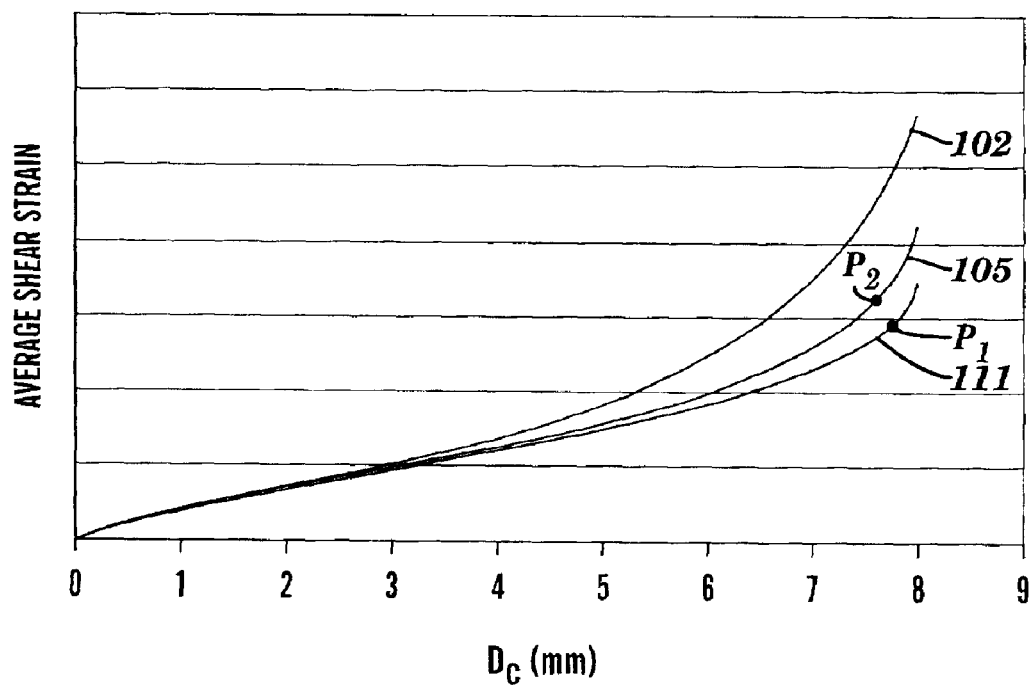
FIG. 3 is a plot of shear strain on the solder ball of FIG. 1 as a function of distance between the center of the chip and the solder ball centerline.
Figure 4:
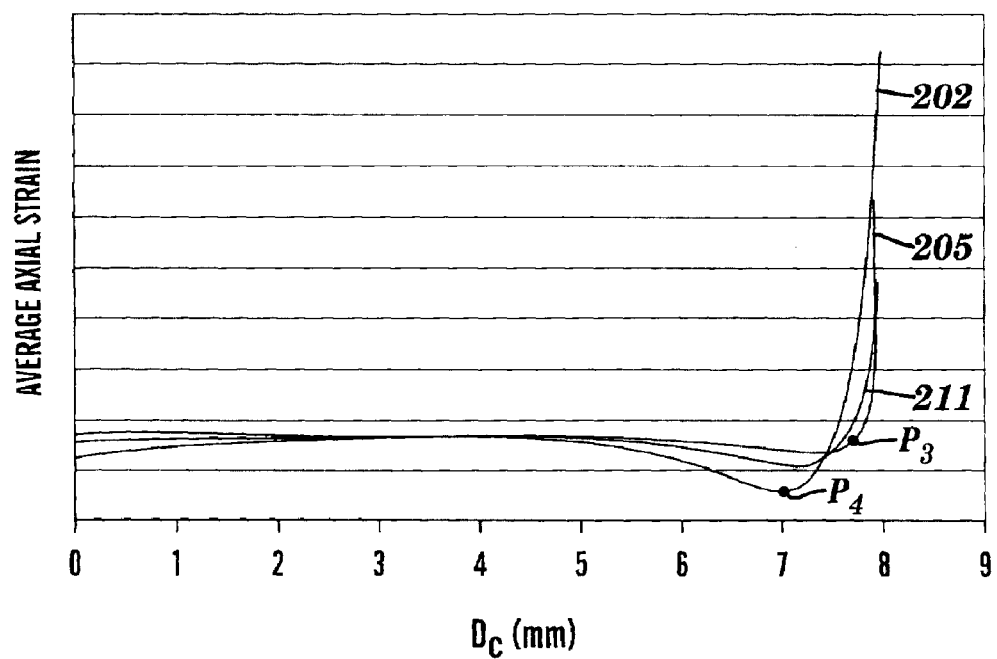
FIG. 4 is a plot of axial strain on the solder ball of FIG. 1 as a function of distance between the center of the chip and the solder ball centerline.

The beneficial effect of increasing D$_{EDGE}$ within hundreds of microns from the nearest chip edge 13 is also illustrated by FIGS. 3 and 4. FIGS. 3 and 4 are plots of average shear strain and average axial strain, respectively, on the solder member 16 at the interface between the solder member 16 and the pad 20 of the semiconductor substrate 12. The average shear strain in FIG. 3 is in a plane that is defined by directions 8 and 9 in FIG. 1, whereas the average axial strain in FIG. 4 is parallel to the direction 9. Both the shear strain in FIG. 3 and the axial strain in FIG. 4 are spatially averaged over the portion of the pad surface 32 that interfaces the C4 solder ball 16.

In FIGS. 3 and 4, the semiconductor substrate 12 is a silicon semiconductor chip, the organic substrate 14 is an organic chip carrier comprising a glass epoxy core with organic buildup layers, and the solder member 16 was a C4 solder ball comprising a lead-tin alloy having weight concentrations of about 97% lead and about 3% tin. An underfill 24 material is present with a modulus of from 2 to 11 GPa. The edge 13 of the chip 12 is about 8 mm from the center (not shown) of the chip 12. The surface 18 of the chip 12 has dimensions of 16 mm×16 mm. The height H of the C4 solder ball is 0.1 mm.

In the simulations underlying FIGS. 3 and 4, the electronic structure 10 was thermally cycled from 100° C. to 0° C., and back to 100° C., in each cycle. The resulting shear strain in FIG. 3 and axial strain in FIG. 4 are each plotted as a function of $D_C$, wherein $D_C$ is a distance in the direction 8 from the center of the semiconductor substrate 12 to the centerline 26 of the solder member 16 (see FIG. 1). FIG. 3 shows three shear strain curves 102, 105, and 111, respectively corresponding to elastic modulii of 2 Gpa, 5 Gpa, and 11 Gpa of the underfill 24. Similarly, FIG. 4 shows three axial strain curves 202, 205, and 211, respectively corresponding to elastic modulii of 2 GPa, 5 GPa, and 11 GPa of the underfill 24.

In FIG. 3, the average shear strain falls most sharply when the C4 solder ball centerline 26 is between about 0.25 mm and about 0.40 mm from the edge 13 of the chip 12, depending on which of the three curves 102, 105, and 111 is relevant. The 0.25 mm distance is the change in $D_C$ between the point $P_1$ on the curve 111 (where a sharp change in slope occurs) and $D_C$=8 mm corresponding to the edge 13 of the chip 12. The 0.40 mm distance is the change in $D_C$ between the point $P_2$ on the curve 105 (where a sharp change in slope occurs) and $D_C$=8 mm corresponding to the edge 13 of the chip 12.

In FIG. 4, the average axial strain falls most sharply when the C4 solder ball centerline 26 is between about 0.30 mm and about 1.0 mm from the edge 13 of the chip 12, depending on which of the three curves 202, 205, and 211 is relevant. The 0.30 mm distance is the change in $D_C$ between the point $P_3$ on the curve 211 (where a sharp change in slope occurs) and $D_C$=8 mm corresponding to the edge 13 of the chip 12. The 1.0 mm distance is the change in $D_C$ between the point $P_4$ on the curve 202 (where a sharp change in slope occurs) and $D_C$=8 mm corresponding to the edge 13 of the chip 12. Based on the preceding results, the second inventive technique includes several embodiments with respect to $D_{EDGE}$. With a first embodiment of the second inventive technique, based on the average shear strain curves of FIG. 3, $D_{EDGE}$ is at least about 0.25 mm. With a second embodiment of the second inventive technique, based on the average shear strain curves of FIG. 3, $D_{EDGE}$ is at least about 0.40 mm. With a third embodiment of the second inventive technique, based on the average axial strain curves of FIG. 4, $D_{EDGE}$ is at least about 0.30 mm. With a third embodiment of the second inventive technique, based on the average axial strain curves of FIG. 4, $D_{EDGE}$ is at least about 1.00 mm.

The present invention's effectiveness relates to the fact that the interface between the solder member 16 and the pad 20 is more prone to thermal stress damage than is the interface between the solder member 16 and the pad 20, because there is a greater difference in CTE between the solder member 16 and the pad 20 than between the solder member 16 and the pad 22. Accordingly, a CTE coupling parameter P characterizes the aforementioned differentials in CTE, wherein P is defined as $(C_{SOLDER}-C_{ORGANIC})/(C_{SOLDER}-C_{SEMI})$, wherein $C_{SOLDER}$ is a CTE of the solder member 16, wherein $C_{ORGANIC}$ is a CTE of the organic substrate 14, and wherein $C_{SEMI}$ is a CTE of the semiconductor substrate 12. Assuming that $C_{SOLDER}>C_{ORGANIC}>C_{SEMI}$, P must satisfy 0<P<1. P=1 represents a perfectly symmetric distribution of said differential CTE between the pad 20 and the pad 22, while P=0 represents a perfectly asymmetric distribution of said differential CTE between the pad 20 and the pad 22. For the ranges of CTE stated supra for the solder member 16, the organic substrate 14, and the semiconductor substrate 12, P satisfies 0.17<P<0.72. Thus, a comprehensive range for P is 0.15<P<0.75 for the range of CTEs considered herein.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:
   a semiconductor substrate having a first electrically conductive pad thereon;
   an organic substrate having a second electrically conductive pad thereon, wherein a surface area of the first pad exceeds a surface area of the second pad; and
   a solder member disposed between the first and the second pad such that the solder member electrically couples the first pad to the second pad, wherein a portion of the solder member is in direct mechanical contact with the semiconductor substrate.

2. An electronic structure, comprising:
   a semiconductor substrate having a first electrically conductive pad thereon;
   an organic substrate having a second electrically conductive pad thereon, wherein a surface area of the first pad exceeds a surface area of the second pad; and
   a solder member electrically coupling the first pad to the second pad, wherein a coefficient of thermal expansion (CTE) of the organic substrate is between about 10 ppm/° C. and about 18 ppm/° C.

3. An electronic structure, comprising:
   a semiconductor substrate having a first electrically conductive pad thereon;
   an organic substrate having a second electrically conductive pad thereon, wherein a surface area of the first pad exceeds a surface area of the second pad; and
   a solder member electrically coupling the first pad to the second pad, wherein P is between about 0.15 and about 0.75, wherein P is defined as $(C_{SOLDER}-C_{ORGANIC})/(C_{SOLDER}-C_{SEMI})$, wherein $C_{SOLDER}$ is a CTE of the solder member, wherein $C_{ORGANIC}$ is a CTE of the organic substrate, and wherein $C_{SEMI}$ is a CTE of the semiconductor substrate.

4. An electronic structure, comprising:
   a semiconductor substrate having a first electrically conductive pad thereon;
   an organic substrate having a second electrically conductive pad thereon, wherein a surface area of the first pad exceeds a surface area of the second pad; and
   a solder member electrically coupling the first pad to the second pad, wherein the solder member includes a controlled collapse chip connection (C4) solder ball.

5. The electronic structure of claim 4, wherein the organic substrate includes an organic material selected from the group consisting of an epoxy, a polyimide, a polytetrafluoroethylene, and combinations thereof.

6. The electronic structure of claim 4, wherein the solder member includes a lead-tin alloy.

7. An electronic structure, comprising;
a semiconductor substrate having a first electrically conductive pad thereon;
an organic substrate having a second electrically conductive pad thereon, wherein a surface area of the first pad exceeds a surface of the second pad;
a solder member electrically coupling the first pad to the second pad; and
an underfill material between the semiconductor substrate and the organic substrate, wherein the underfill material encapsulates the solder member, and wherein the underfill material has an elastic modulus of at least about 1 gigapascal.

8. An electronic structure, comprising:
a semiconductor chip having a first electrically conductive pad thereon;
an organic chip carrier having a second electrically conductive pad thereon, wherein a surface area of the first pad exceeds a surface area of the second pad;
a solder member electrically coupling the first pad to the second pad; and
an underfill material between the semiconductor chip and the organic chip carrier, wherein the underfill material encapsulates the solder member, and wherein the underfill material has an elastic modulus of at least about 1 gigapascal.

9. An electronic structure, comprising:
a semiconductor substrate having a first electrically conductive pad thereon;
an organic substrate having a second electrically conductive pad thereon, wherein a surface area of the first pad exceeds a surface area of the second pad by a factor of at least about 1.2; and
a solder member electrically coupling the first pad to the second pad.

10. An electronic structure, comprising:
a semiconductor substrate having a first electrically conductive pad thereon;
an organic substrate having a second electrically conductive pad thereon, wherein a surface area of the first pad exceeds a surface area of the second pad by a factor between about 1.1 and about 1.3; and
a solder member electrically coupling the first pad to the second pad.

11. An electronic structure, comprising:
a semiconductor substrate having a first electrically conductive pad thereon;
an organic substrate having a second electrically conductive pad thereon, wherein a surface area of the first pad exceeds a surface area of the second pad by a factor between about 1.3 and about 2.0; and
a solder member electrically coupling the first pad to the second pad.

12. An electronic structure, comprising:
a semiconductor substrate having a first electrically conductive pad thereon;
an organic substrate having a second electrically conductive pad thereon; and
a solder member electrically coupling the first pad to the second pad, wherein a distance from a centerline of the solder member to a closest lateral edge of the semiconductor substrate is at least about 0.25 mm.

13. The electronic structure of claim 12, wherein a coefficient of thermal expansion (CTE) of the organic substrate is between about 10 ppm/° C. and about 18 ppm/° C.

14. The electronic structure of claim 12, wherein P is between about 0.15 and about 0.75, wherein P is defined as $(C_{SOLDER}-C_{ORGANIC})/(C_{SOLDER}-C_{SEMI})$, wherein $C_{SOLDER}$ is a CTE of the solder member, wherein $C_{ORGANIC}$ is a CTE of the organic substrate, and wherein $C_{SEMI}$ is a CTE of the semiconductor substrate.

15. The electronic structure of claim 12, wherein the organic substrate includes an organic material selected from the group consisting of an epoxy, a polymide, a polytetraflouroethylene, and combinations thereof.

16. The electronic structure of claim 12, wherein the solder member includes a controlled collapse chip connection (C4) solder ball.

17. The electronic structure of claim 12, wherein the solder member includes a lead-tin alloy.

18. An electronic structure, comprising:
a semiconductor chip having a first electrically conductive pad thereon;
an organic chip carrier having a second electrically conductive pad thereon;
a solder member electrically coupling the first pad to the second pad, wherein a distance of the solder member of the member to a closest lateral edge of the semiconductor substrate is at least about 0.25 mm; and
an underfill material between the semiconductor chip and the organic chip carrier, wherein the underfill material encapsulates the solder member, and wherein the underfill material has an elastic modulus of at least about 1 gigapascal.

19. An electronic structure, comprising:
a semiconductor substrate having a first electrically conductive pad thereon;
an organic substrate having a second electrically conductive pad thereon; and
a solder member electrically coupling the first pad to the second pad, wherein a distance from a centerline of the solder member to a closest lateral edge of the semiconductor substrate is at least about 0.40 mm.

* * * * *

UNITED STATES PATENT AND TRADEMARK OFFICE
CERTIFICATE OF CORRECTION

| | |
|---|---|
| PATENT NO. | : 7,067,916 B2 |
| APPLICATION NO. | : 09/885853 |
| DATED | : June 27, 2006 |
| INVENTOR(S) | : Bernier et al. |

It is certified that error appears in the above-identified patent and that said Letters Patent is hereby corrected as shown below:

<u>Column 6</u>
Line 24, delete "first and" and insert -- first pad and --

<u>Column 8</u>
Line 22, delete "polymide" and insert -- polyimide --

Signed and Sealed this

Tenth Day of October, 2006

JON W. DUDAS
*Director of the United States Patent and Trademark Office*